US009805988B1

(12) United States Patent
Bentley et al.

(10) Patent No.: US 9,805,988 B1
(45) Date of Patent: Oct. 31, 2017

(54) METHOD OF FORMING SEMICONDUCTOR STRUCTURE INCLUDING SUSPENDED SEMICONDUCTOR LAYER AND RESULTING STRUCTURE

(71) Applicant: GLOBALFOUNDRIES INC., Grand Cayman (KY)

(72) Inventors: Steven Bentley, Menands, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/366,514

(22) Filed: Dec. 1, 2016

(51) Int. Cl.
| H01L 21/8238 | (2006.01) |
| H01L 21/84 | (2006.01) |
| H01L 29/78 | (2006.01) |
| H01L 29/36 | (2006.01) |
| H01L 29/66 | (2006.01) |

(Continued)

(52) U.S. Cl.
CPC .... *H01L 21/823821* (2013.01); *H01L 21/266* (2013.01); *H01L 21/324* (2013.01); *H01L 21/845* (2013.01); *H01L 27/0886* (2013.01); *H01L 27/0924* (2013.01); *H01L 27/1211* (2013.01); *H01L 29/36* (2013.01); *H01L 29/66545* (2013.01); *H01L 29/66553* (2013.01);

(Continued)

(58) Field of Classification Search
CPC ........... H01L 21/823821; H01L 21/845; H01L 27/0924; H01L 27/0886; H01L 27/1211; H01L 29/66795

See application file for complete search history.

(56) References Cited

U.S. PATENT DOCUMENTS 8,883,597 B2  11/2014  Chang et al.
9,023,715 B2   5/2015  Faul et al.
(Continued)

FOREIGN PATENT DOCUMENTS

WO  2014204477 A1  12/2014
WO  2015047253 A1   4/2015

OTHER PUBLICATIONS

Bentley et al., "Method, Apparatus, and System for Reducing Dopant Concentrations in Channel Regions of Finfet Devices" U.S. Appl. No. 15/224,139; GF Ref. No. HU074; filed Jul. 29, 2016; 62 pages.

*Primary Examiner* — Phat X Cao
(74) *Attorney, Agent, or Firm* — Francois Pagette; Hoffman Warnick LLC

(57) ABSTRACT

One aspect of the disclosure is directed to a method of forming a semiconductor structure including: forming a fin over a substrate within a device region, the fin including alternating layers of a sacrificial material and a semiconductor material, and including a lower channel region; forming a dopant-containing layer over the fin and the substrate; exposing an upper portion of the fin by removing the dopant-containing layer from the upper portion of the fin; removing the sacrificial material from the fin thereby suspending the semiconductor material within the fin between a pair of spacers and over the lower channel region of the fin; performing an anneal to drive in dopants from the dopant-containing layer to the lower channel region of the fin; and forming an active gate over the lower channel region of the fin and substantially surrounding the suspended semiconductor material over the lower channel region of the fin.

16 Claims, 8 Drawing Sheets

(51) Int. Cl.
  *H01L 21/266*  (2006.01)
  *H01L 21/324*  (2006.01)
  *H01L 27/12*   (2006.01)
  *H01L 27/092*  (2006.01)
  *H01L 27/088*  (2006.01)

(52) U.S. Cl.
  CPC ...... *H01L 29/66795* (2013.01); *H01L 29/785* (2013.01)

(56)  References Cited

U.S. PATENT DOCUMENTS

| | | |
|---|---|---|
| 9,330,982 B1 | 5/2016 | Cao et al. |
| 9,385,189 B1 | 7/2016 | Sung et al. |
| 2016/0118480 A1* | 4/2016 | Xie .................. H01L 29/66795 257/347 |
| 2016/0190137 A1 | 6/2016 | Tsai et al. |
| 2017/0179128 A1* | 6/2017 | Balakrishnan ...... H01L 27/0924 |
| 2017/0213911 A1* | 7/2017 | Balakrishnan ...... H01L 29/7848 |

* cited by examiner

METHOD OF FORMING SEMICONDUCTOR STRUCTURE INCLUDING SUSPENDED SEMICONDUCTOR LAYER AND RESULTING STRUCTURE

BACKGROUND

Technical Field

The present disclosure relates to semiconductor structures, and more particularly to methods of forming semiconductor structures including a vertically spaced semiconductor layer and resulting structures.

Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (with both n-type MOS (NMOS) and p-type MOS (PMOS) transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A FET, irrespective of whether an NMOS transistor or a PMOS transistor is considered, and irrespective of whether it is a planar or 3D device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode together may sometimes be referred to as the gate stack structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit, device designers have greatly reduced the physical size of FETs over the years. More specifically, the channel length of FETs can be scaled down significantly (i.e., channel length decreased), which can improve the switching speed of FETs. A number of challenges arise as feature sizes of FETs and integrated circuits get smaller. For example, significant downsizing of traditional planar FETs leads to electrostatic issues and electron mobility degradation. Scaled-down planar FETS have shorter gate lengths that make it more difficult to control the channel. New device architectures such as "gate-all-around" nanowire or nanosheet structures allow further scaling of the integrated circuits, in part because the gate wraps around the channel and provides better control with lower leakage current, faster operations, and lower output resistance.

In a lateral nanosheet or nanowire FET (here referred to as a nanosheet FET), the channel region includes an active channel region including a series of stacked semiconductor materials, and a parasitic channel region beneath the active channel region. The semiconductor material of the active channel region may be surrounded by a gate stack. The "gate all around" structure of a nanosheet FET has advantageous short channel characteristics over the electrostatics that the conventional planar FETs or FinFETs provide. Multiple nanosheets can be used to form the channel of a FET to increase the current capacity. However, there are process challenges in enabling large scale fabrication of nanowire/nanosheet FETs due to their size and structure. One challenge with conventional nanosheet FETs is preventing the up-diffusion of dopants from the parasitic channel region into the active channel region during fabrication.

SUMMARY

A first aspect of the disclosure is directed to a method of forming a semiconductor structure. The method including: forming a fin over a substrate within a device region, the fin including alternating layers of a sacrificial material and a semiconductor material, and including a lower channel region of the fin beneath the alternating layers of the sacrificial material and the semiconductor material; forming a dopant-containing layer over the fin and the substrate; exposing an upper portion of the fin by removing the dopant-containing layer from the upper portion of the fin; removing the sacrificial material from the fin thereby suspending the semiconductor material within the fin between a pair of spacers and over the lower channel region of the fin; performing an anneal to drive in dopants from the dopant-containing layer to the lower channel region of the fin; and forming an active gate over the lower channel region of the fin and substantially surrounding the suspended semiconductor material over the lower channel region of the fin.

A second aspect of the disclosure is directed to a method of forming a semiconductor structure. The method including: forming a set of fins over a substrate, wherein each fin in the set of fins includes alternating layers of a sacrificial material and a semiconductor, and includes a lower channel region beneath the alternating layers of the sacrificial material and the semiconductor material, and wherein the set of fins includes a first fin in a first device region and a second fin in a second device region; forming a first dopant-containing layer over the set of fins and the substrate; exposing the first fin in the first device region by removing the first dopant-containing layer thereover; forming a second dopant-containing layer over the exposed first fin in the first device region and over the first dopant-containing layer over the second fin in the second device region; exposing an upper portion of each of the first fin and the second fin; removing the sacrificial material from each of the first fin and the second fin thereby suspending portions of the semiconductor material over the lower channel region within each of the first fin and the second fin, the suspended semiconductor material being suspended between a pair of spacers on each of the first and second fins; performing an anneal to drive dopants from the first dopant-containing layer into the lower channel region of the first fin and to drive dopants from the second dopant-containing layer into the lower channel region of the second fin; and forming an active gate stack over the lower channel region of each of the first fin and the second fin, the active gate stack substantially surrounding the suspended portions of the semiconductor material of each fin.

A third aspect of the disclosure is related to a semiconductor structure. The semiconductor structure may include: a set of fins over a substrate including a first fin in a first device region and a second fin in a second device region, wherein each fin in the set of fins includes a lower channel region and a vertically spaced semiconductor layer over the lower channel region; and an active gate stack over the lower channel region of each fin in the set of fins and substantially surrounding the vertically spaced semiconductor material of each fin in the set of fins, wherein the lower channel region of the first fin is oppositely doped relative to the lower channel region of the second fin.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 8-13 show a cross-sectional view of the preliminary semiconductor structure taken at the PC level.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to semiconductor structures, and more particularly to methods of forming semiconductor structures including a vertically spaced semiconductor layer and resulting structures. In contrast to conventional semiconductor structures, aspects of the disclosure include a semiconductor structure having an active channel region including vertically spaced semiconductor nanosheets substantially surrounded by an active gate stack. The vertically spaced semiconductor nanosheets do not include the dopants of a lower, parasitic channel region within a fin. That is, aspects of the present disclosure provide for a method of forming a semiconductor structure wherein there is no up-diffusion of dopants from the parasitic channel region into the vertically spaced semiconductor layer of the active channel region. It should further be understood that the embodiments described herein can equally be applied to any lateral nanowire or nanosheet configuration, including structures of variable cross-sectional aspect ratio and multiple vertically stacked channels.

Figure 1:
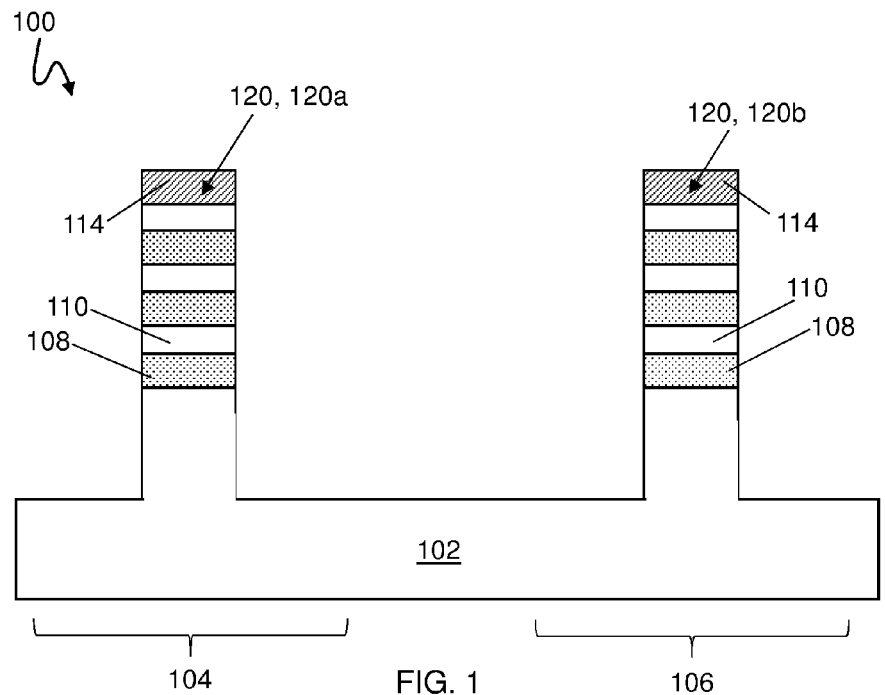
FIG. 1 shows a cross-sectional view of a preliminary semiconductor structure at the fin level according to embodiments of the disclosure.

FIG. 1 shows a cross-sectional view of a preliminary semiconductor structure 100. Semiconductor structure 100 may include a semiconductor substrate 102. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer. The semiconductor layers of an SOI substrate may include any of the semiconductor substrate materials discussed herein. The insulator layer of the SOI substrate may include any now known or later developed SOI substrate insulator such as but not limited to silicon oxide. Substrate 102 may include a first device region 104 and a second device region 106. Device regions 104, 106 may define regions in which active devices, e.g., transistors, may be formed as known in the art. Device regions 104, 106 may be laterally adjacent to one another over or within substrate 102. Device regions 104, 106 may be separated from one another by conventional shallow trench isolation regions (not shown).

Embodiments of the disclosure may include forming a fin including alternating layers of a sacrificial material 108 and a semiconductor material 110 over substrate 102. More specifically, a sacrificial material 108 may be formed, e.g., deposited, over substrate 102. Further, additional amounts of the material used for substrate 102 (hereinafter "semiconductor material 110") may be formed, e.g., deposited, over sacrificial material 108, and additional amounts of the material used for sacrificial material 108 may be formed, e.g., deposited, over semiconductor material 110. In this way, alternating layers of sacrificial material 108 and semiconductor material 110 are formed over semiconductor substrate 102. The material selected for sacrificial material 108 may include any of the semiconductor materials discussed herein relative to substrate 102 but may include a composition that is different from the composition of substrate 102 and/or semiconductor material 110. For example, sacrificial material 108 may include silicon germanium (SiGe) and substrate 102 and semiconductor material 110 may each include silicon (Si). In another example, sacrificial material 108 may include silicon (Si) and substrate 102 and semiconductor material 110 may each include silicon germanium (SiGe). In yet another example, substrate 102 and semiconductor material 110 may each include indium gallium arsenide (InGaAs) and sacrificial layer 108 may include indium aluminum arsenide (InAlAs). Alternatively, substrate 102 and semiconductor material 110 may each include indium arsenide indium arsenide (InAs) and sacrificial layer 108 may include gallium antimonide (GaSb). As will be described herein, sacrificial material 108 will be removed from semiconductor structure 100 and semiconductor material 110 will remain. Therefore, semiconductor material 110 and sacrificial material 108 may each be selected based on which material composition is desired to be removed and which is desired to remain part of semiconductor structure 100.

As used herein, "depositing," "deposition," etc., may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation.

It is to be understood that while three layers of sacrificial material 108 and semiconductor material 110 are shown, any number of layers of sacrificial material 108 and semiconductor material 110 may be formed without departing from aspect of the disclosure. After the alternating layers of sacrificial material 108 and semiconductor material 110 are formed, a hard mask 114 may be formed, e.g., deposited, over the uppermost layer of the alternating layers of sacrificial material 108 and semiconductor material 110. Hard mask 114 may include any conventional hard mask materials, e.g., silicon nitride (SiN). One or more (or a set of) semiconductor fins 120 may be patterned and etched from hard mask 114, semiconductor material 110, sacrificial layer 108, and substrate 102.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solution, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

As shown in FIG. 1, set of fins 120 may include a first fin 120a within device region 104 and a second fin 120b within device region 106. Fins 120 may each include the alternating layers of semiconductor material 110 and sacrificial material 108 with hard mask 114 thereover.

Figure 2:
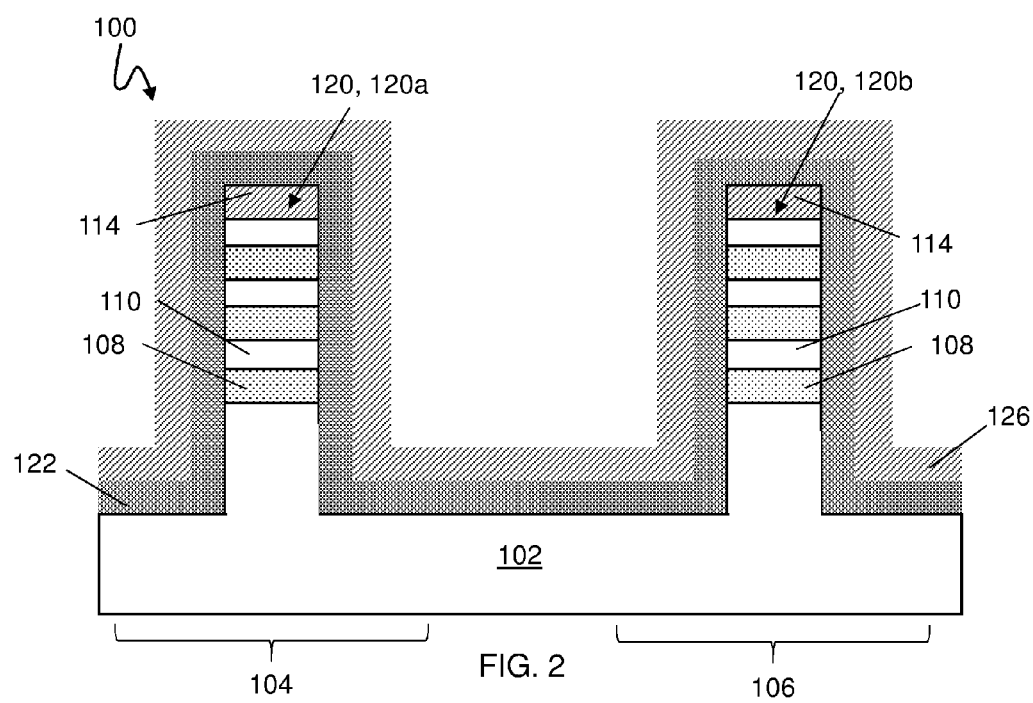
FIGS. 2-15 show a cross-sectional view of the preliminary semiconductor structure of FIG. 1 undergoing aspects of methods according to embodiments of the disclosure, where
Figure 3:
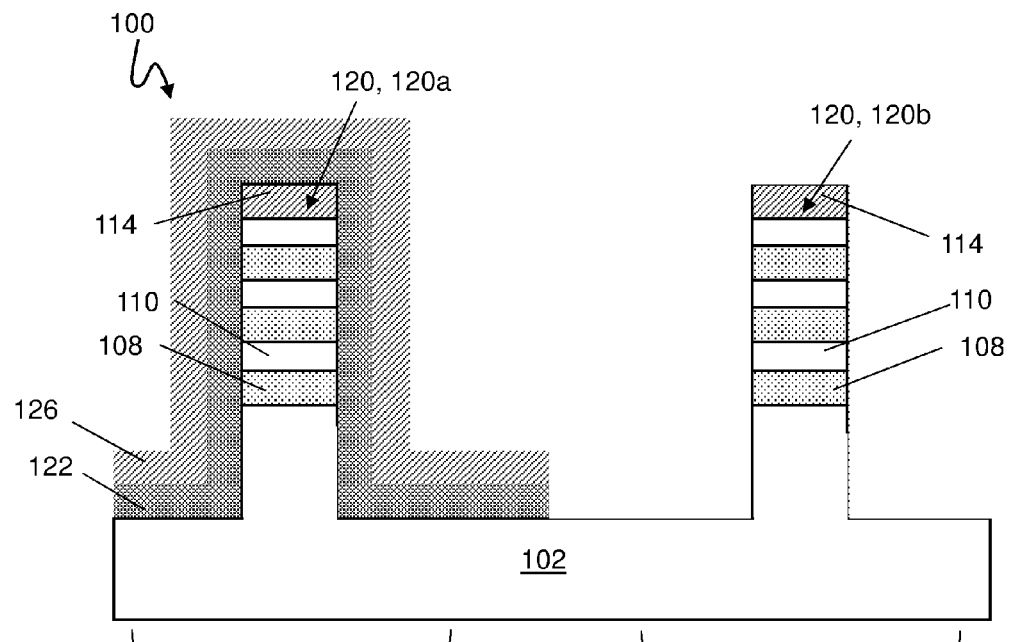

Turning now to FIG. 2, embodiments of the disclosure may include forming a dopant-containing layer 122 over fins 120 and substrate 102. Dopant-containing layer 122 may be formed, for example, by conformal deposition over fins 120. More specifically, dopant-containing layer 122 may be formed by plasma enhanced (PE) ALD. Dopant-containing layer 122 may be formed over each fin 120, or more specifically, over hard mask 114 over each fin. Additionally, dopant-containing layer 122 may be formed over substrate 102 adjacent to and between each fin 120. Dopant-containing layer 122 may include a p-type dopant or an n-type dopant. N-type dopants in silicon may include, but are not limited to: phosphorous (P), arsenic (As), and/or antimony (Sb). N-type is an element introduced to semiconductor to generate free electron (by "donating" electron to semiconductor); must have one more valance electron than semiconductor. P-type is an element introduced to semiconductor to generate free hole (by "accepting" electron from semiconductor atom and "releasing" hole at the same time. An acceptor atom must have one valence electron less than the host semiconductor. Boron (B) is the most common acceptor in silicon technology. Alternatives include indium and gallium. It should be understood that for materials other than silicon, different dopants from those listed are required. For example, silicon may become an n-type dopant in certain III-V semiconductor channels while, for example, zinc is a p-dopant. Dopant-containing layer 122 may include at least one of: boron silica glass (BSG) or phosphosilicate glass (PSG). In some embodiments, dopant-containing layer 122 may be a bilayer and also include silicon dioxide ($SiO_2$). Further, another hard mask 126 may be formed, conformally deposited, over dopant-containing layer 122. Hard mask 126 may include any of the hard mask materials discussed herein. As shown in FIG. 3, hard mask 126 may be patterned and etched to exposed dopant-containing layer 122 over device region 106. Further, the exposed dopant-containing layer 122 may be removed, e.g., via etching, from over fin 120b in device region 106 to expose fin 120b having hard mask 114 thereover. The etching may also expose portions of substrate 102 within device region 106. The etching may include, for example, wet etching, RIE, and/or a reactive clean process.

Figure 4:
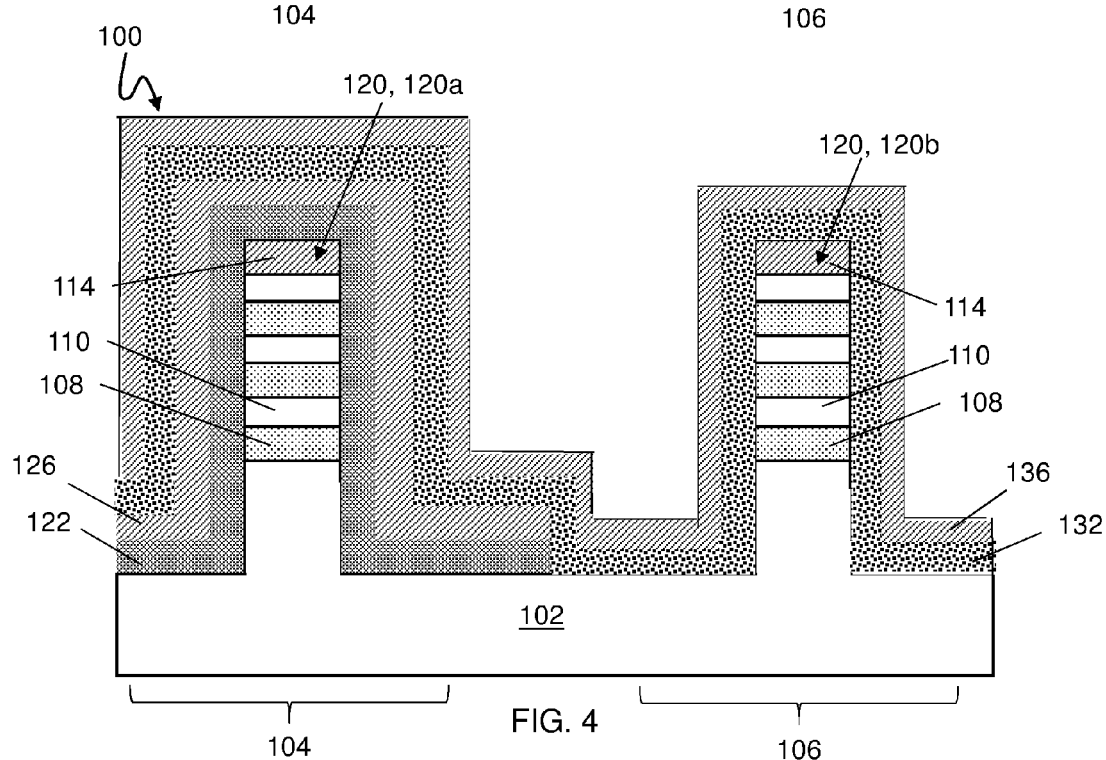

Turning now to FIG. 4, another dopant-containing layer 132 may be formed, e.g., conformally deposited, over hard mask 114 over exposed fin 120b within device region 106 and over hard mask 126 that is over fin 120a in device region 104. Further, dopant-containing layer 132 may be formed over exposed portions of substrate 102 within device region 106. Dopant-containing layer 132 may be formed, for example, by conformal deposition. Dopant-containing layer 132 may also be formed over hard mask 126 over fin 120a in device region 104. More specifically, dopant-containing layer 132 may be formed by plasma enhanced (PE) ALD. Dopant-containing layer 132 may include any of the materials discussed relative to dopant-containing layer 122. For example, dopant-containing layer 132 may include at least one of: BSG or PSG. In some embodiments, dopant-containing layer 132 may be a bilayer and also include silicon dioxide ($SiO_2$). In some embodiments, dopant-containing layer 132 may include a dopant type that is opposite of the dopant type of dopant-containing layer 122. For example, dopant-containing layer 122 may include BSG and dopant-containing layer 132 may include PSG, or vice versa. Further, another hard mask 136 may be formed, conformally deposited, over dopant-containing layer 132 within each device region 104, 106. Hard mask 136 may include any of the hard mask materials discussed herein.

Figure 5:
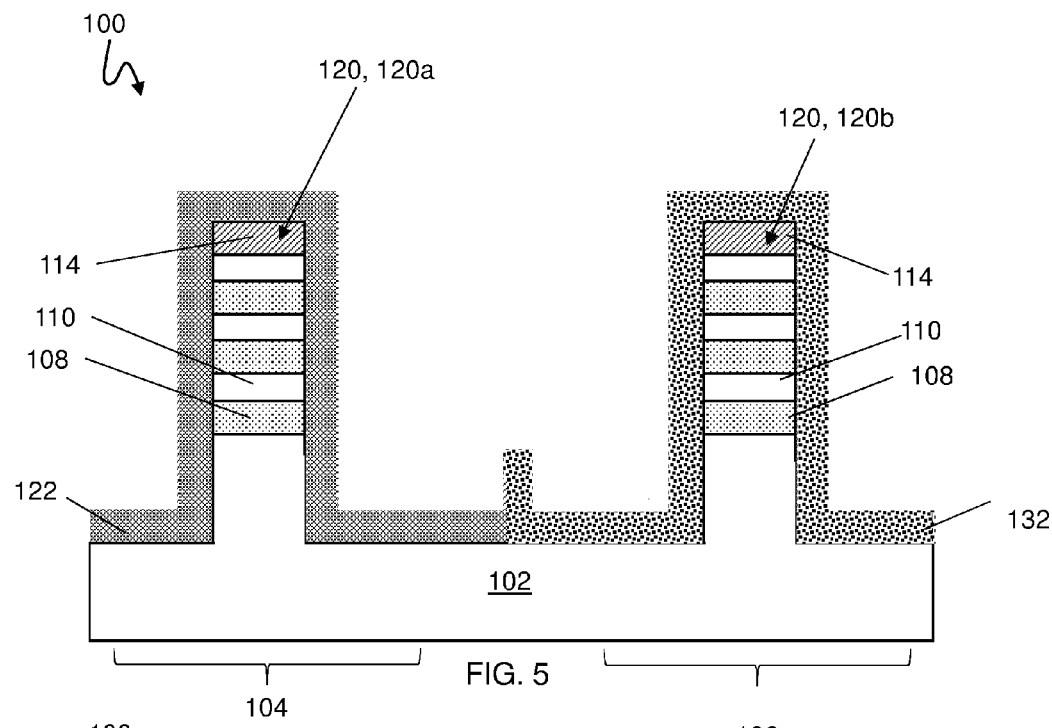
Figure 6:
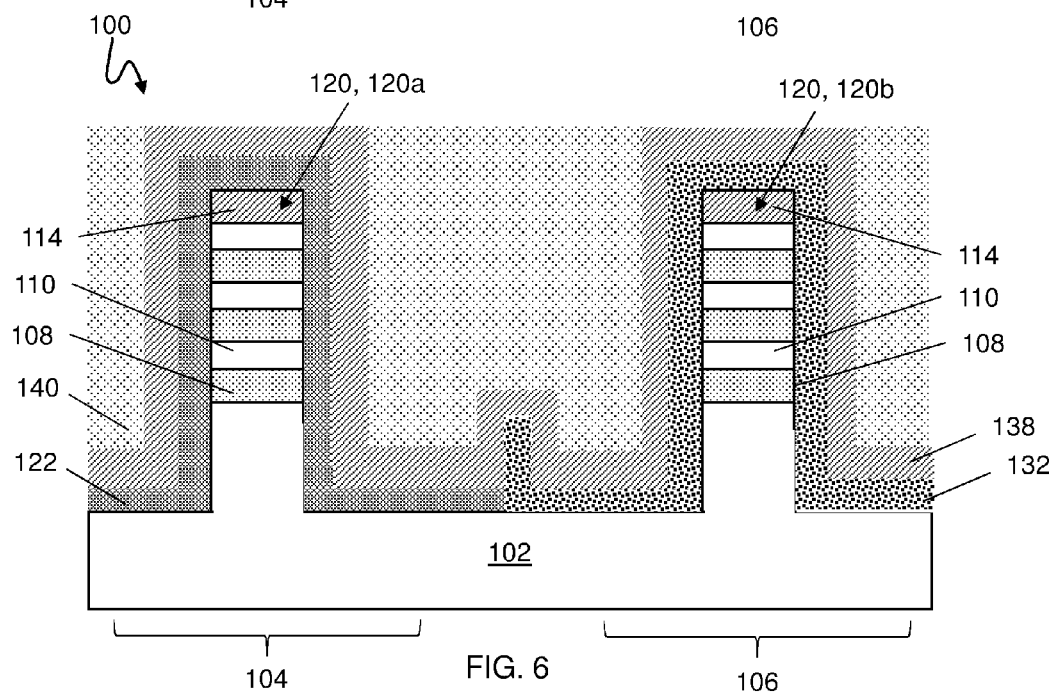
Figure 15:
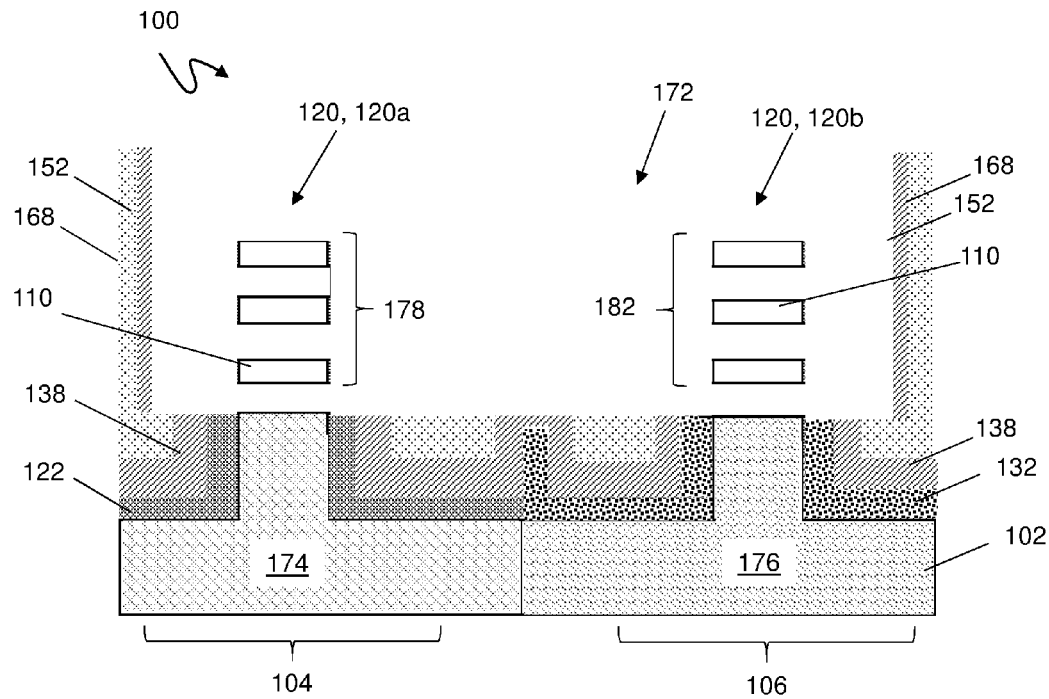

As shown in FIG. 5, semiconductor structure 100 may undergo one or more etching processes. For example, hard mask 136 (FIG. 4) may be patterned and etched to expose dopant-containing layer 132 over fin 120a in device region 104. However, hard mask 136 may remain over dopant-containing layer 132 over fin 120b in device region 106. Dopant-containing layer 132 and hard mask 126 (FIG. 4) may be removed, via etching, to expose dopant containing layer 122. Because hard mask 136 remains over dopant-containing layer 132 in device region 106 during the removal of dopant-containing layer 132 from device region 104, dopant-containing layer 132 in device region 106 is unaffected or unetched. Further, remaining portions of hard mask 136 may be removed, e.g., via etching, to expose dopant-containing layer 132 over fin 120b in device region 106. After each of dopant-containing layer 122 and dopant-containing layer 132 are exposed in device region 104 and device region 106, respectively, another hard mask 138 may be formed, e.g., deposited, over exposed dopant-containing layer 122 in device region 104 and exposed dopant-containing layer 132 in device region 106 as shown in FIG. 6. Additionally, an insulating layer 140 may be formed over hard mask 138 in device region 104 and device region 106. When depositing insulating layer 140, a low temperature deposition technique may be used such as, for example, at a temperature less approximately 800° C., to ensure that no dopants from dopant containing layers 122, 132 drive in to lower channel regions 174, 176 (FIG. 15). Insulating layer 140 may include any insulating material such as silicon dioxide ($SiO_2$) or a "high-k" dielectric having a high dielectric constant (where "k" denotes the material's dielectric constant), which may be, for example, above 3.9. In some situations, insulating layer 140 may be composed of an oxide substance. Insulating layer 140 can initially be formed as a single, continuous layer or group of insulating layers, each of which can be separately processed to include trenches, cavities, etc. Materials appropriate for the composition of insulting layer 140 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide (ErOx), and other currently known or later developed materials having similar properties. As is known in the art, the properties of insulating layer 140, including the magnitude of each layer's dielectric constant for each layer, can allow for different types of layers to serve as, e.g., a "high-k" layer, a "low-k" layer, an "ultra low-k" layer, etc. Insulating layer 140 may be planarized to a top surface of hard mask 138 over each fin 120 in each device region 104, 106.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 7:
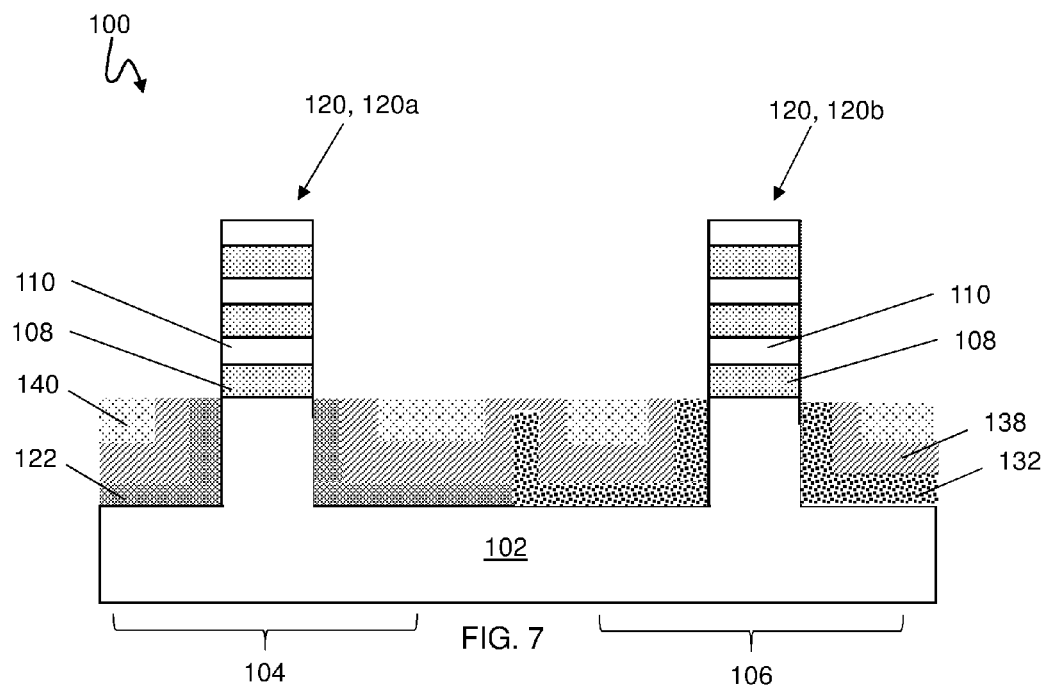

Turning now to FIG. 7, embodiments of the disclosure include exposing an upper portion of fin 120 by removing dopant-containing layers 122, 132 from the upper portion of fins 120. That is, semiconductor structure 100 may be recessed, e.g., via etching and/or grinding, to expose an upper portion or a top surface of fins 120. More specifically, portions of insulating layer 140, hard mask 138, dopant-containing layer 122, dopant-containing layer 132, and hard mask 114 over fins 120 may be removed to expose a top surface of fins 120.

FIGS. 8-16 show semiconductor structure 100 undergoing preliminary processes for creating PC or gate formation. FIGS. 8-13 show a cross-sectional view of fin 120b at the PC level. While not shown, it is to be understood, the processes described with respect to FIGS. 8-13 are equally applicable to fin 120a.

Figure 8:
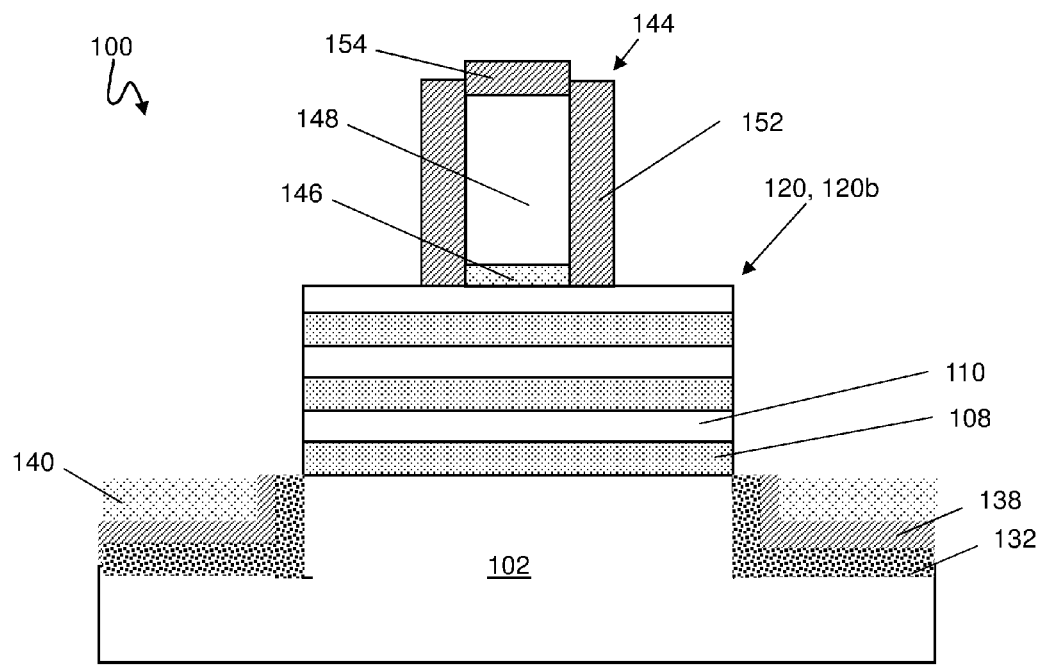

Turning now to FIG. 8, a dummy gate structure 144 may be formed over fins 120. Dummy gate structure 144 may be formed by depositing a gate insulation layer 146 over semiconductor material 110 of fins 120. Gate insulation layer 146 may include any now know or later developed gate insulation material, e.g., a high-k dielectric, and/or any of the dielectric or insulating materials discussed herein. Further, a dummy gate material 148 may be deposited over gate insulation layer 146. Dummy gate material 148 may include any now know or later developed dummy gate material, e.g., polysilicon. Together, gate dielectric layer 146 and dummy gate material 148 may be patterned and etched to a desired width over fins 120. Additionally, a spacer material may be deposited over and adjacent to dummy gate material 148 and gate dielectric layer 146. That is, embodiments of the disclosure include forming a pair of spacers adjacent to and on opposing sides of dummy gate structure 144. More specifically, the spacer material may be patterned and etched to form spacers 152 on fins 120 adjacent to gate insulation layer 146 and dummy gate material 148. The spacer material may include any now known or later developed spacer material, e.g., silicon nitride, and/or silicon dioxide. Further, a gate cap layer 154 may be formed over dummy gate material 148 using conventional deposition and lithography techniques. Gate cap layer 154 may include any now know or later discovered gate cap material, e.g., silicon nitride and/or silicon dioxide.

Figure 9:
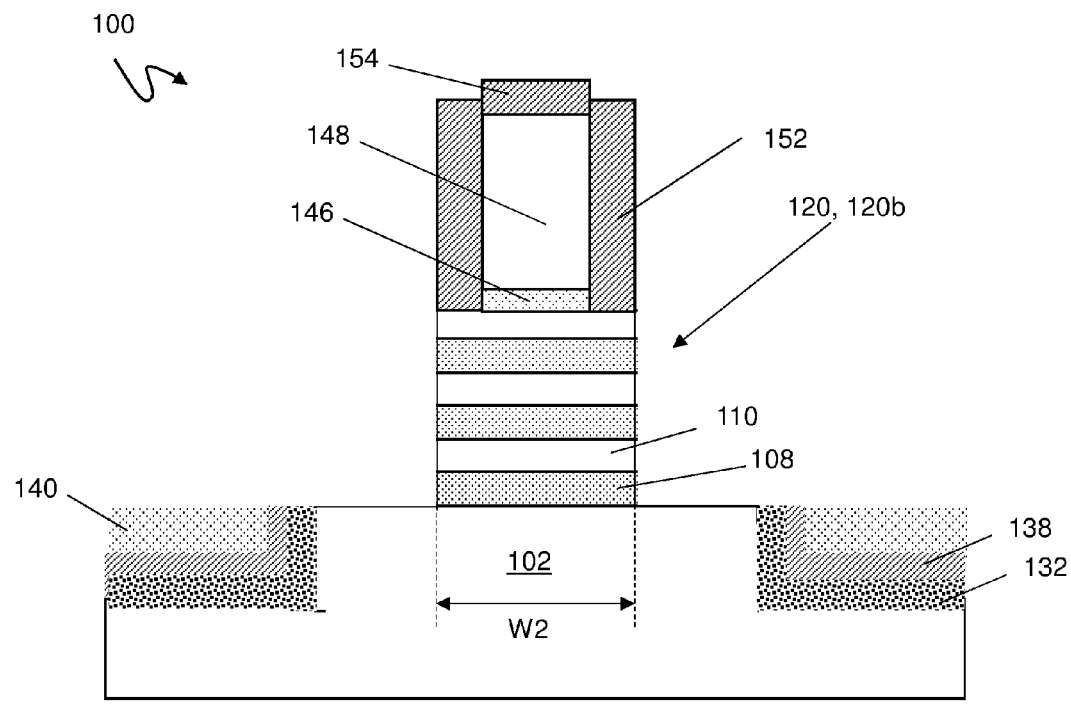
Figure 10:
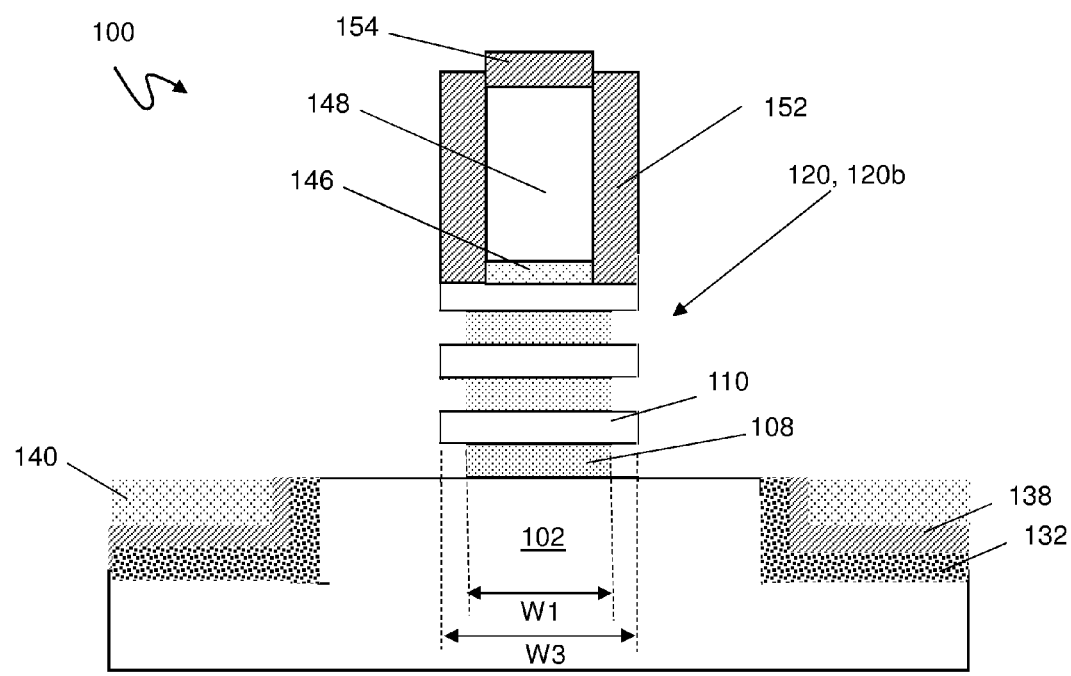

Turning now to FIG. 9, fins 120 may be etched or recessed. More specifically, fins 120 may be etched or recessed, e.g., by anisotropic etching, such that only a portion of fins 120 that are disposed beneath spacers 152 and dummy gate structure 144 remains. In such an embodiment, a portion of substrate 102 is exposed. Additionally, as shown in FIG. 10, sacrificial material 108 may be etched or laterally etched back such that sacrificial material 108 has a width W1 that is less than a width W2 of sacrificial material 108 (FIG. 9). Additionally, width W1 of sacrificial material 108 may be less than a width W3 of semiconductor material. That is, sacrificial material 108 may be etched such that semiconductor material 110 is unharmed or unetched. More specifically, an etch selective to sacrificial material 108 may be employed, such as, for example, a wet etch, RIE, isotropic, and/or anisotropic etch. As should be clear, width W1 of sacrificial material 108 in FIG. 10 may be reduced with respect to width W2 of sacrificial material 108 in FIG. 9 along the PC view. That is, the width of the cross-section of sacrificial material 108 along the PC view may be reduced while the width of the cross-section of sacrificial material 108 along the fin level (FIG. 7) may not be reduced or harmed.

Figure 11:
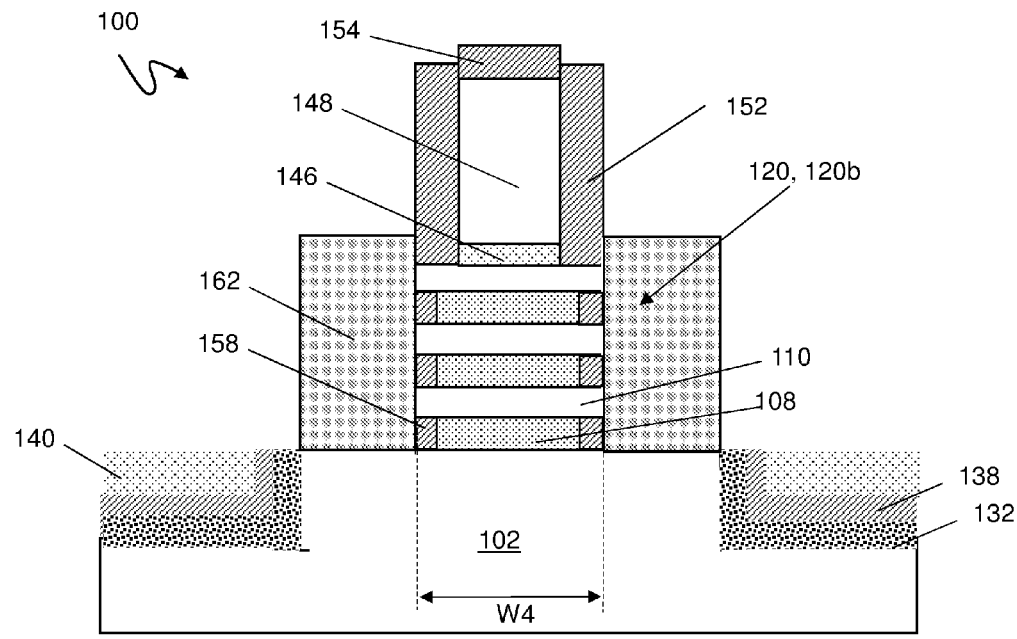

Turning now to FIG. 11, another spacer material may be formed by depositing and etched to form spacers 158. The spacer material may include any now known or later discovered spacer material, e.g., silicon nitride, and/or silicon dioxide. Spacers 158 may be formed laterally adjacent to sacrificial material 108 and between semiconductor materials 102, 110. That is, spacers 158 may be formed on opposing sides of semiconductor material 108 in the cross-section taken along the PC view. Together, spacers 158 and sacrificial material 108 may have a width W4 that is equal to a width W3 (FIG. 10) of semiconductor material 110. Additionally, source/drain regions 162 may be formed over substrate 102 and laterally adjacent to spacers 158 and semiconductor material 110. Source/drain regions 162 may be formed, for example, by epitaxial growth. Source/drain regions 162 may include, for example, at least one of: silicon, silicon carbon, and/or silicon germanium. Source/drain regions 162 may be doped with at least one of: a p-type or an n-type dopant.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 12:
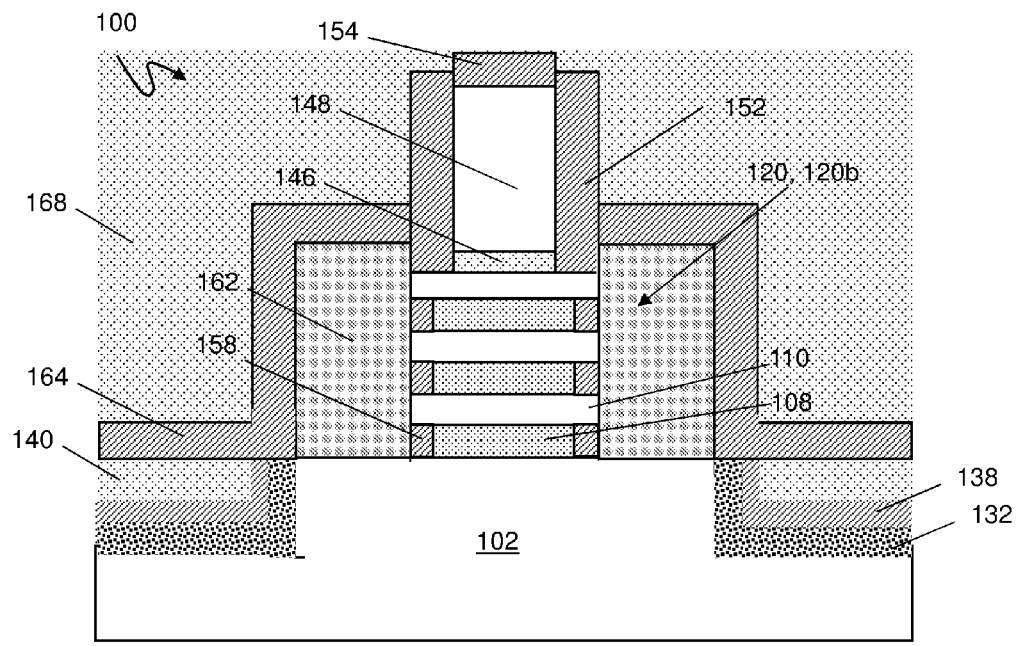

Turning now to FIG. 12, another hard mask 164 may be formed, e.g., deposited, over semiconductor structure 100. More specifically, hard mask 164 may be formed over source/drain regions 162, insulating layer 140, hard mask 138, and dopant-containing layer 132. Hard mask 164 may include any of the hard mask materials discussed herein. Further, another insulating material 168 may be formed over hard mask 164, spacers 152, and gate cap layer 154. Insulating material 168 may include any of the insulating materials discussed herein. Further, insulating material 168 may be planarized to a top surface of gate cap layer 154 such that a top surface of gate cap layer 154 is exposed.

Figure 13:
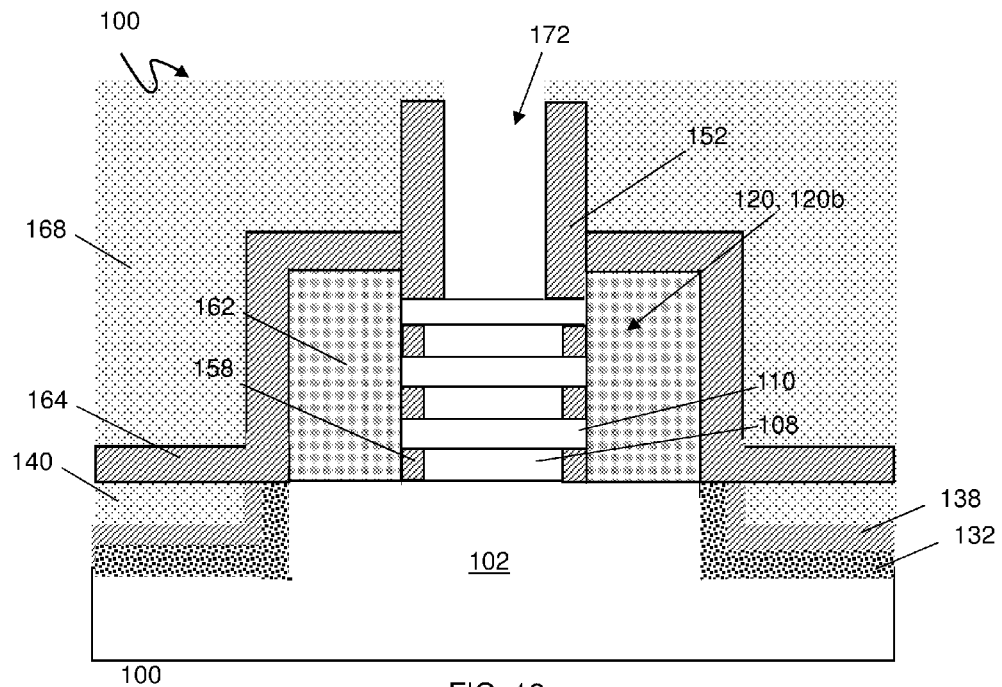
Figure 14:
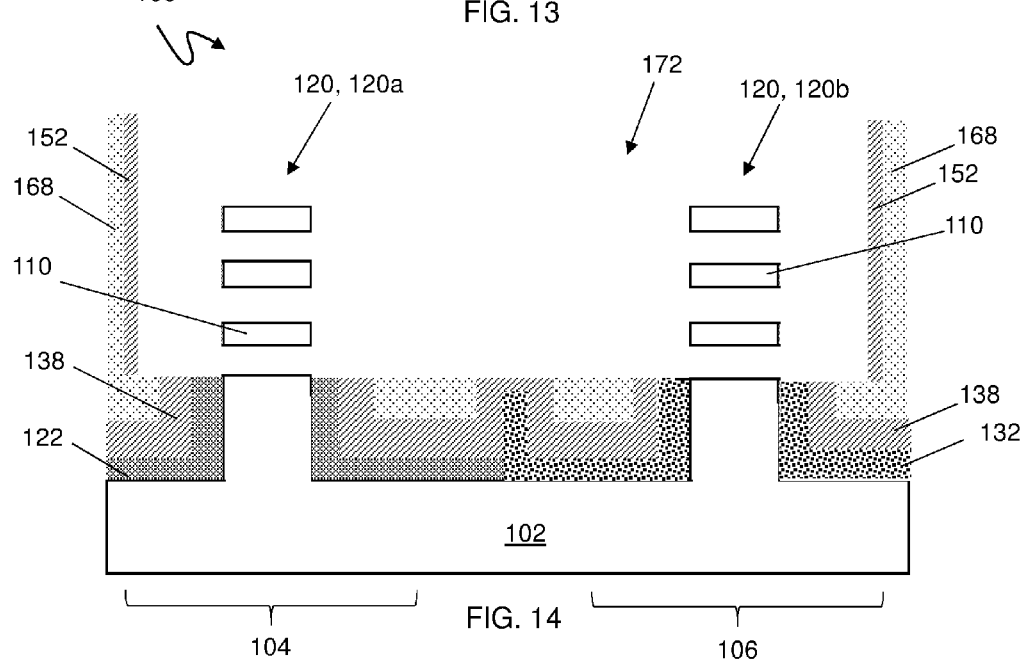

As shown in FIG. 13, embodiments of the disclosure include removing dummy gate structure 144 to expose fins 120 between spacers 152. More specifically, the exposed gate cap layer 154 (FIG. 12), dummy gate material 148 (FIG. 12), and gate dielectric 146 (FIG. 12) may be removed, e.g., via etching, to create an opening 172 within spacers 152 and insulating layer 168. Further, sacrificial material 108 may be removed from semiconductor structure 100. That is, embodiments of the disclosure include removing sacrificial material 108 from fins 120 thereby suspending or vertically spacing semiconductor material 110 of fins 120 between spacers 152 and over channel region 174, 176 of fins 120. Sacrificial material 108 may be removed by etching, e.g., wet etching, RIE, isotropic, and/or anisotropic etching. As shown in the cross-section of FIG. 13 taken at the PC level, opening 172 exposes a top surface of semiconductor material 110 of fins 120. As shown in the cross-section of FIG. 14, taken at the fin level, semiconductor material 110 remains and is suspended or vertically spaced over substrate 102. Semiconductor material 110 is held in place by spacers 158 (FIG. 13) and source/drain regions 162 (FIG. 13). The removing of sacrificial material 108 from each fin 120 causes semiconductor material to suspend or vertically space over a channel region 174, 176 within each fin 120.

Turning now to FIG. 15, an anneal may be performed to drive dopants from dopant-containing layer 122 into channel region 174 of fin 120a in device region 104 and from dopant-containing layer 132 into channel region 176 of fin 120b in device region 106. As shown in FIG. 15, the anneal does not cause dopants from dopant-containing layer 122 to diffuse or drive-in to suspended semiconductor material 110 of fin 120a. In this way, suspended or vertically spaced semiconductor material 110 results in an active channel region 178 of fin 120a that does not include dopants from dopant-containing layer 122. Similarly, the anneal does not cause dopants from dopant-containing layer 132 to diffuse into suspended or vertically spaced semiconductor material 110 of fin 120b. In this way, suspended or vertically spaced semiconductor material 110 results in an active channel region 182 of fin 120b that does not include dopants from dopant-containing layer 132.

Figure 16:
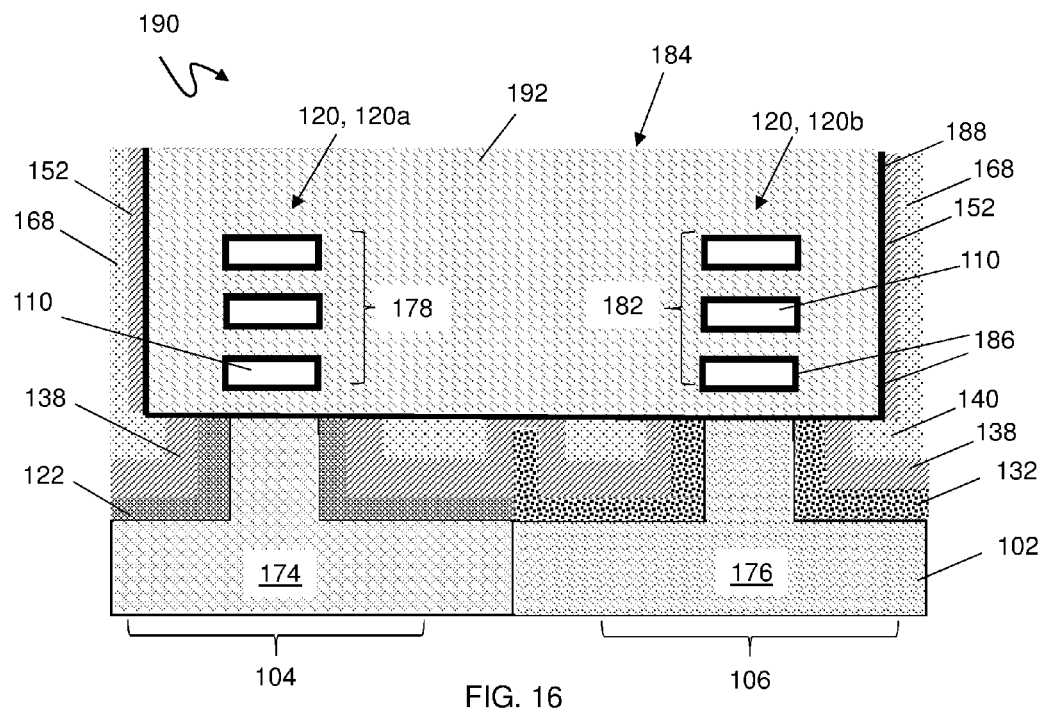
FIG. 16 shows a cross-sectional view of a resulting semiconductor structure after undergoing aspects of methods according to embodiments of the disclosure.

Turning now to FIG. 16, an active gate stack 184 may be formed in opening 172 and between the suspended or vertically spaced semiconductor materials 110 and substrate 102. That is, embodiments of the disclosure include forming active gate stack 184 over channel region 174, 176. Active gate stack 184 may include a gate insulation layer 188 and an active gate material 192. Active gate stack 184 may be formed by conformal deposition of gate insulation layer 188 such that gate dielectric 188 is formed such that it substantially surrounds the vertically spaced semiconductor material 110 of active gate regions 178, 182. Additionally, gate insulation layer 188 may be formed such that it substantially lines opening 172. In this way, gate insulation layer 188 is formed over portions of hard mask 138, dopant-containing layers 122, 132, insulating layer 140, and channel regions 174, 176 of fins 120. Gate insulation layer 188 may include any now known or later developed gate dielectric material, e.g., a high-k dielectric, and/or any of the dielectric or insulating materials discussed herein.

Active gate material 192 may be deposited over gate insulation layer 188 such that it substantially surrounds gate insulation layer 188 surrounding the vertically spaced semiconductor material 110 of active channel regions 178, 182. Active gate material 192 may substantially fill opening 172. Active gate material 192 may be planarized to a top surface of insulating layer 168. As known in the art, active gate material 192 may include more than one material such as for example, work function metal layers, optional barrier layers, and gate conductor layers, but is shown as a single layer in FIG. 16 for brevity. As known in the art, work function metal layers may act as a doping source, and a different work function setting metal can then be employed depending on whether a NFET or a PFET device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Optional barrier layers may include, for example, titanium nitride, tantalum nitride, hafnium nitride, hafnium silicon nitride, titanium silicon nitride, tantalum silicon nitride, tungsten nitrogen carbide, and hafnium aluminum nitride. Gate conductor layers may include, for example, at least one of: titanium, titanium nitride, tungsten, tungsten nitride, copper, copper nitride, tantalum, or tantalum nitride.

The resulting semiconductor structure 190 as shown in FIG. 16, may include fins 120 over substrate 102. Fin 120a may be disposed in device region 104 and fin 120b may be disposed in device region 106. Fins 120 may each include a lower, parasitic channel region 174, 176. Fins 120 may also each include an active channel region 178, 182 having a vertically spaced semiconductor material 110 over lower, parasitic channel region 174, 176. Active gate stack 192 may be formed over channel regions 178, 182 of fins 120 and substantially surround the vertically spaced semiconductor material 110 of active channel regions 178, 182. The lower, parasitic channel region 174 of fin 120a may be oppositely doped as compared to the lower, parasitic channel region 186 of fin 120b. Semiconductor structure 190 may also include dopant-containing layer 122 beneath active gate stack 192 and substantially surrounding channel region 174 of fin 120a. Dopant-containing layer 132 may be disposed beneath active gate stack 192 and substantially surround channel region 176 of fin 120b. Dopant-containing layers 122, 132 may be oppositely doped relative to each other. Further, semiconductor structure 190 may also include hard mask 138 over each dopant-containing layer 122, 132. Gate insulation layer 188 may be disposed over channel regions 174, 176 of each fin 120 and immediately surrounding semiconductor layers 110 of active channel regions 178, 182 of each fin 120.

In contrast to conventional semiconductor structures, aspects of the disclosure include a semiconductor structure having an active channel region including suspended or vertically spaced semiconductor layers substantially surrounded by an active gate stack. The suspended or vertically spaced semiconductor layers do not include the dopants of a lower, parasitic channel region that is disposed within a fin. That is, aspects of the present disclosure provide for a method of forming a semiconductor structure wherein there is no up-diffusion of dopants from the lower, parasitic channel region into the suspended or vertically spaced semiconductor layer of the active channel region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a semiconductor structure, the method comprising:
    forming a fin over a substrate within a device region, the fin including alternating layers of a sacrificial material and a semiconductor material, and including a lower channel region of the fin beneath the alternating layers of the sacrificial material and the semiconductor material;
    forming a dopant-containing layer over the fin and the substrate;
    exposing an upper portion of the fin by removing the dopant-containing layer from the upper portion of the fin;
    removing the sacrificial material from the fin thereby suspending the semiconductor material within the fin between a pair of spacers and over the lower channel region of the fin;
    performing an anneal to drive in dopants from the dopant-containing layer to the lower channel region of the fin; and
    forming an active gate over the lower channel region of the fin and substantially surrounding the suspended semiconductor material over the lower channel region of the fin.

2. The method of claim 1, further comprising:
    after the exposing of the upper portion the fin and prior to the removing of the sacrificial material, forming a dummy gate structure over the fin;
    forming the pair of spacers adjacent to the dummy gate structure over the fin; and
    removing the dummy gate structure to expose the fin between the pair of spacers.

3. The method of claim 2, wherein the forming of the active gate stack includes forming the active gate stack between the pair of spacers.

4. The method of claim 1, wherein the performing of the anneal does not drive-in dopants from the dopant containing layer to the suspended semiconductor material over the lower channel region.

5. A method of forming a semiconductor structure, the method comprising:
   forming a set of fins over a substrate, wherein each fin in the set of fins includes alternating layers of a sacrificial material and a semiconductor, and includes a lower channel region beneath the alternating layers of the sacrificial material and the semiconductor material, and wherein the set of fins includes a first fin in a first device region and a second fin in a second device region;
   forming a first dopant-containing layer over the set of fins and the substrate;
   exposing the first fin in the first device region by removing the first dopant-containing layer thereover;
   forming a second dopant-containing layer over the exposed first fin in the first device region and over the first dopant-containing layer over the second fin in the second device region;
   exposing an upper portion of each of the first fin and the second fin;
   removing the sacrificial material from each of the first fin and the second fin thereby suspending portions of the semiconductor material over the lower channel region within each of the first fin and the second fin, the suspended semiconductor material being suspended between a pair of spacers on each of the first and second fins;
   performing an anneal to drive dopants from the first dopant-containing layer into the lower channel region of the first fin and to drive dopants from the second dopant-containing layer into the lower channel region of the second fin; and
   forming an active gate stack over the lower channel region of each of the first fin and the second fin, the active gate stack substantially surrounding the suspended portions of the semiconductor material of each fin.

6. The method of claim 5, further comprising:
   prior to the forming of the set of fins, forming the alternating layers of the sacrificial material and the semiconductor material over the substrate; and
   patterning a hard mask over the alternating layers of the sacrificial material and the semiconductor material,
   wherein the forming the set of fins includes forming the set of fins such that a remaining portion of the hard mask remains over each fin in the set of fins.

7. The method of claim 5, further comprising:
   after the forming of the first dopant-containing layer and prior to the exposing of the first fin, forming a first hard mask layer over the first dopant-containing layer,
   wherein the exposing of the first fin includes removing a portion of the first dopant-containing layer and the first hard mask layer from over the first dopant-containing layer over the first fin such that a portion of the first dopant-containing layer remains over the second fin.

8. The method of claim 7, further comprising:
   after the forming of the second dopant-containing layer and prior to the exposing the upper portion of each of the first fin and the second fin, forming a second hard mask layer over the second dopant-containing layer;
   removing the second hard mask layer to expose the second dopant-containing layer; and
   removing the second dopant-containing layer and the first hard mask layer from over the second fin in the second device region to expose the first dopant-containing layer over the second fin;
   forming a third hard mask layer over the first dopant-containing layer over the first fin and the second dopant-containing layer over the second fin; and
   forming an insulator over the substrate and between each fin in the set of fins.

9. The method of claim 8, wherein the exposing the upper portion of each of the first fin and the second fin includes:
   removing the third hard mask layer and the first dopant-containing layer from over the first fin and removing the third hard mask layer and the second dopant-containing layer from over the second fin.

10. The method of claim 5, further comprising:
    after the exposing of the upper portion of each of the first fin and the second fin and prior to the removing of the sacrificial material, forming a dummy gate structure over the set of fins;
    forming the pair of spacers adjacent to the dummy gate structure over the set of fins; and
    removing the dummy gate structure to expose a portion of the set of fins between the pair of spacers.

11. The method of claim 10, wherein the forming of the active gate stack includes forming the active gate stack between the spacers.

12. The method of claim 10, wherein the performing of the anneal does not drive-in dopants from the dopant containing layer to the suspended semiconductor material over the lower channel region.

13. The method of claim 5, wherein the first device region includes a p-type field effect transistor (pFET) and the second device region includes an n-type field effect transistor (nFET), and
    wherein the first dopant-containing layer includes an n-type dopant and the second dopant-containing layer includes a p-type dopant.

14. The method of claim 5, wherein the first device region includes an n-type field effect transistor (nFET) and the second device region includes a p-type field effect transistor (pFET), and
    wherein the first dopant-containing layer includes a p-type dopant and the second dopant-containing layer includes an n-type dopant.

15. The method of claim 5, wherein the sacrificial material includes silicon germanium and the semiconductor material includes silicon.

16. The method of claim 5, wherein the sacrificial material includes silicon and the semiconductor material includes silicon germanium.

* * * * *